(12) United States Patent
Huff et al.

(10) Patent No.: US 9,019,686 B2
(45) Date of Patent: Apr. 28, 2015

(54) VARIABLE CAPACITOR TUNED USING LASER MICROMACHINING

(75) Inventors: Michael A. Huff, Oakton, VA (US); Mehmet Ozgur, Reston, VA (US)

(73) Assignee: Corporation for National Research Initiatives, Reston, VA (US)

( * ) Notice: Subject to any disclaimer, the term of this patent is extended or adjusted under 35 U.S.C. 154(b) by 0 days.

(21) Appl. No.: 13/611,619

(22) Filed: Sep. 12, 2012

(65) Prior Publication Data

US 2013/0008875 A1    Jan. 10, 2013

Related U.S. Application Data

(62) Division of application No. 12/216,006, filed on Jun. 27, 2008.

(60) Provisional application No. 60/929,481, filed on Jun. 29, 2007.

(51) Int. Cl.
| | |
|---|---|
| *H01G 5/00* | (2006.01) |
| *H01G 5/14* | (2006.01) |
| *H01L 49/02* | (2006.01) |

(52) U.S. Cl.
CPC .............. *H01G 5/145* (2013.01); *H01L 28/60* (2013.01)

(58) Field of Classification Search
CPC ............ H01G 2/12; H01G 2/14; H01G 5/16; H01G 5/18; H01G 7/06; H01G 4/30; H01G 4/38; H01G 4/224; H01G 4/228; H01G 4/248; H01G 4/232

USPC .......... 361/281, 277, 278, 279, 283.1, 283.3, 361/287–290, 292
See application file for complete search history.

(56) References Cited

U.S. PATENT DOCUMENTS

| | | | |
|---|---|---|---|
| 2,139,453 A | 12/1938 | Linder | |
| 2,696,577 A | 12/1954 | Smith | |
| 3,659,205 A | 4/1972 | Cooke et al. | |
| 3,694,710 A | 9/1972 | Kirschner | |
| 3,821,617 A | 6/1974 | Shelby et al. | |
| 3,947,934 A | 4/1976 | Olson | |
| 4,190,854 A | 2/1980 | Redfern | |
| 4,217,570 A | 8/1980 | Holmes | |
| 4,312,024 A | 1/1982 | Pest | |
| 4,439,814 A | 3/1984 | Rhodes | |

(Continued)

OTHER PUBLICATIONS

Non Final Office Action in U.S. Appl. No. 12/216,006, mailed Jul. 7, 2011.

(Continued)

*Primary Examiner* — Nguyen T Ha
(74) *Attorney, Agent, or Firm* — Nixon & Vanderhye, PC

(57) ABSTRACT

A variable capacitor device is disclosed in which the capacitive tuning ratio and quality factor are increased to very high levels, and in which the capacitance value of the device is tuned and held to a desired value with a high level of accuracy and precision using a laser micromachining tuning process on suitably designed and fabricated capacitor devices. The tuning of the variable capacitor devices can be performed open-loop or closed-loop, depending on the precision of the eventual capacitor value needed or desired. Furthermore, the tuning to a pre-determined value can be performed before the variable capacitor device is connected to a circuit, or alternatively, the tuning to a desired value can be performed after the variable capacitor device has been connected into a circuit.

25 Claims, 4 Drawing Sheets

(56) References Cited

U.S. PATENT DOCUMENTS

| | | | |
|---|---|---|---|
| 4,470,096 A | 9/1984 | Guertin | |
| 4,792,779 A | 12/1988 | Pond et al. | |
| 4,924,064 A | 5/1990 | Stormbom et al. | |
| 5,034,851 A | 7/1991 | Monsorno et al. | |
| 5,040,093 A | 8/1991 | Greuel | |
| 5,264,983 A | 11/1993 | Petrinec | |
| 5,345,361 A | 9/1994 | Billotte et al. | |
| 5,347,423 A | 9/1994 | deNeuf et al. | |
| 5,443,534 A * | 8/1995 | Vinciarelli et al. | 29/593 |
| 5,621,157 A * | 4/1997 | Zhao et al. | 73/1.38 |
| 5,640,133 A | 6/1997 | MacDonald et al. | |
| 5,696,662 A | 12/1997 | Bauhahn | |
| 5,726,608 A | 3/1998 | Årlin | |
| 5,926,363 A | 7/1999 | Kuriyama | |
| 5,959,516 A | 9/1999 | Chang et al. | |
| 6,134,117 A | 10/2000 | Funk et al. | |
| 6,212,056 B1 * | 4/2001 | Gammel et al. | 361/277 |
| 6,215,644 B1 | 4/2001 | Dhuler | |
| 6,266,227 B1 | 7/2001 | Konushi et al. | |
| 6,353,527 B2 * | 3/2002 | Kinoshita et al. | 361/277 |
| 6,355,534 B1 | 3/2002 | Cheng et al. | |
| 6,356,429 B2 | 3/2002 | Hayashi | |
| 6,373,682 B1 | 4/2002 | Goodwin-Johansson | |
| 6,377,438 B1 | 4/2002 | Deane et al. | |
| 6,418,006 B1 | 7/2002 | Liu et al. | |
| 6,418,007 B1 | 7/2002 | Lacy et al. | |
| 6,437,965 B1 | 8/2002 | Adkins et al. | |
| 6,461,929 B1 | 10/2002 | Lobl et al. | |
| 6,490,147 B2 | 12/2002 | Yoon et al. | |
| 6,507,475 B1 | 1/2003 | Sun | |
| 6,556,415 B1 | 4/2003 | Lee et al. | |
| 6,800,912 B2 | 10/2004 | Ozgur | |
| 6,856,499 B2 * | 2/2005 | Stokes | 361/277 |
| 6,909,589 B2 | 6/2005 | Huff | |
| 6,954,348 B1 | 10/2005 | Rodgers | |
| 6,969,630 B2 | 11/2005 | Ozgur | |
| 7,440,254 B2 * | 10/2008 | Gallant | 361/277 |
| 7,545,622 B2 | 6/2009 | Morris et al. | |
| 2002/0171121 A1 | 11/2002 | Ozgur | |
| 2003/0099082 A1 | 5/2003 | Tuo et al. | |
| 2003/0179535 A1 | 9/2003 | Shimanouchi et al. | |
| 2004/0097066 A1 | 5/2004 | Ozgur | |
| 2004/0150939 A1 | 8/2004 | Huff | |
| 2004/0234903 A1 | 11/2004 | Kubacki | |
| 2005/0078721 A1 * | 4/2005 | Wu et al. | 372/38.01 |
| 2007/0206340 A1 | 9/2007 | Shimanouchi et al. | |
| 2008/0232075 A1 | 9/2008 | Karasawa et al. | |
| 2008/0273285 A1 | 11/2008 | Christian et al. | |

OTHER PUBLICATIONS

Final Office Action in parent U.S. Appl. No. 12/216,006, mailed Aug. 6, 2012.

* cited by examiner

VARIABLE CAPACITOR TUNED USING LASER MICROMACHINING

This application is a divisional application of U.S. application Ser. No. 12/216,006, filed Jun. 27, 2008, which claims the benefit of U.S. Provisional Application No. 60/929,481, filed Jun. 29, 2007, the entire contents of each of which are incorporated by reference in this application.

This application claims the benefit of U.S. Provisional Application No. 60/929,481, filed Jun. 29, 2007, the entire contents of which are incorporated by reference in this application.

FIELD OF THE INVENTION

The present invention relates to tunable or variable capacitors, and more particularly, to tunable or variable capacitors fabricated using MEMS or micromachining technology.

BACKGROUND OF THE INVENTION

MEMS technology is being actively developed by many organizations for implementing components and systems for application in Radio Frequency (RF) systems. The reasons for this interest relate to the distinct advantages the MEMS technology provides over competing technologies, including lower cost and higher performance.

One device that is extremely useful in RF systems is the tunable or variable capacitor component, in which the value of the capacitance of the device can be adjusted using some external means. Most prior embodiments of variable capacitors have been in the form of discrete components, in which the capacitance of the device is adjusted by turning a screw that is coupled to variably overlapping capacitor electrodes. These devices are typically manually adjusted once on the factory floor to achieve a desired "tuned" capacitance value and then left in that state for the life of the product.

The prior discrete variable capacitor technology has several drawbacks as discussed herein. First, the prior variable capacitors are prone to drifting from the desired capacitance value to some other undesired capacitance value over time due to temperature or other environmental effects. This is because the prior variable capacitors are essentially mechanical elements composed of a variety of materials, including a high conductance metal for the electrodes and electrical interconnections, a dielectric positioned between the electrodes, and a mechanical adjustment mechanism by which the overlap of the capacitor electrodes can be adjusted over some range. In addition, each of the materials used for the capacitors has a different coefficient of thermal expansion. Consequently, the materials will expand or contract at different rates, depending on the ambient temperature, thereby resulting in a relative movement of the components in the device made from the different materials.

Second, prior variable capacitors have no capability for active tuning of the device capacitance before or during operational use. This means that once the component value of capacitance has been adjusted on the factory floor, there is no means or mechanism by which the desired capacitance value can be actively maintained or adjusted.

Third, the process of tuning prior variable capacitor devices to a desired capacitance value is a manual operation usually involving a technician, and thus is time intensive and costly. Typically, the technician must make a proper electrical connection to the device or circuit in which the device is located with some sort of test and measurement apparatus, and while monitoring some parameter, adjust the variable capacitor to a desired value by turning a screwdriver mechanism.

Fourth, the process for adjusting capacitors to a desired value is prone to error in a production line environment. Frequently, the capacitor may be turned to the wrong capacitance value. This error is typically detected in later stage testing and usually can be corrected by subsequent tuning adjustment; but, this increases cost significantly. Alternatively, the device out of specification can be scraped, but this is expensive as well. Ultimately, the decision of whether to savage or scrape out-of-spec devices will depend on the economics of a given situation.

Fifth, the prior technology of variable capacitors has a very limited tuning range. This is primarily due to the fact that the mechanical movement is typically limited to a linear motion, and as a result, the tuning ratio (i.e., the ratio of minimum to maximum capacitance values over the entire dynamic range of the device) is generally limited to 10 to 1 or less. The disadvantage of this is that a much larger number of different variable capacitor devices with a slightly different tuning range must be made in order to have capacitors adequately cover the entire range of possible continuous capacitance values. Since almost any value of variable capacitance is desired in practical applications, the result is significantly higher design and manufacturing costs, as well as high inventory costs, as would not be the case with a smaller number of variable capacitors with a larger dynamic range.

Sixth, the current versions of variable capacitors are large in size, and therefore, consume a larger amount of space on the mounting substrates, such as Printed Circuit Boards (PCBs), ceramic substrates, etc. As electronics technology has advanced, almost every other component or system, when viewed at the board or substrate level, has radically decreased in footprint, with the exception of variable capacitors. Consequently, there is the need for variable capacitor devices which are smaller in size.

Seventh, the maximum operating frequency and the quality factors (Q) of the prior variable capacitors are somewhat limited. This is a particular problem as RF systems using these components have steadily moved into higher operational frequency ranges and the performance demands for higher signal to noise ratio and lower power consumption have increased significantly.

Finally, current variable capacitor manufacturing technology has matured to the point where the cost of making the components has been reduced substantially since the introduction of these devices decades ago. However, it is expected that very little improvement in cost reduction will be made in manufacturing these components in the future. Furthermore, despite the cost reduction achievements that have been made, these devices are still relatively expensive when compared to other components. Moreover, as pointed out above, there is a substantial additional cost associated with installing and tuning these devices compared to other components.

Additionally, there is a competing market of discrete surface-mount capacitors, which are available in fixed incremental steps of capacitance values (e.g., 0.1 pF, 0.2 pF, 0.5 pF, etc.), but the absolute value of capacitance of these devices varies over a fairly large range from the manufacturer. That is, if one desires a fixed capacitor of the value 1 pF, the manufacturer can only provide capacitors within a percentage range of the "desired" capacitance value. There is a need for making discrete capacitors having a much improved tolerance of capacitor values.

Although MEMS-based variable capacitors have been previously developed, all of these devices have been realized on traditional semiconductor materials, i.e., primarily silicon wafers. While this approach works for the demonstration of a device, it presents several major disadvantages for the commercialization of discrete microwave or high-frequency RF devices. First, the resistive ohmic losses of the silicon substrate are very high at high operational radio frequencies, i.e., at frequencies above 1 GHz. Second, the cost of silicon substrates and the processes used to fabricate variable capacitor devices on these substrates are too high, compared to existing technologies. Third, the packaging costs of silicon, or other semiconductor material bases, are very high, particularly for devices that must operate at high frequencies and under extreme environmental conditions.

While the losses of the silicon substrate can be reduced appreciably by selectively removing the silicon from under the active devices and the associated signal paths using an isotropic etchant, such as Xenon Diflouride (XeF2), this is an expensive process and one that is not readily compatible with the commercial fabrication of active MEMS devices. Consequently, the resulting manufacturing yield will be low and the cost will increase appreciably. Other semiconductor substrates having lower resistive losses can be employed for the fabrication of MEMS devices, such as Gallium Arsenide (GaAs), resulting in high performance devices. However, the cost of these materials and the costs to fabricate devices on these materials are typically two orders of magnitude higher than silicon wafers and processes. Consequently, the resulting device cost will be substantially higher than the existing macroscale variable capacitor devices. Furthermore, any semiconductor-based variable capacitor device will require a separate packaging technology that will need to be specifically developed to meet the demanding requirements of a commercial product. A conventional die package that will meet the required specifications and simultaneously have a low cost is not readily possible with today's technology.

There is enormous opportunity for MEMS technology in the application of variable capacitors, and if cost and performance goals can be met, the potential market sizes for these devices will be enormous. Also, there is also an enormous opportunity for a micromachining process on discrete capacitors whereby the capacitors can be made inexpensively but having extremely tight tolerances on the capacitance values. However, to exploit these opportunities, there is a need for new low cost and low resistive loss material onto which MEMS devices can be successfully fabricated with high yields. These is also a need to inexpensively be able to accurately and precisely tune these capacitors to a desired capacitance value and have them remain at that value permanently and without electrical stimulation. Furthermore, there is a need for the capability to suitably and inexpensively package these variable capacitor devices.

SUMMARY OF THE INVENTION

The present invention relates generally to tunable or variable capacitors using MEMS or micromachining technology, and in particular, to a variable capacitor device wherein the capacitive tuning ratio and quality factor is increased to very high levels, as well as a variable capacitor device where the capacitance value is tuned and held to the desired value with high level of accuracy and precision using a laser micromachining tuning process on suitably designed and fabricated capacitor devices. The tuning of the variable capacitor devices can be performed open-loop or closed-loop, depending on the precision of the eventual capacitor value needed or desired.

It is, therefore, an object of the present invention to provide a variable capacitor that can be made on a commonly used substrate in the radio frequency technology domain called low-temperature co-fired ceramics ("LTCC"), which has excellent high-frequency performance characteristics.

It is another object of the present invention to provide a variable capacitor that can be made on other commonly used substrates and materials in the radio frequency technology domain, such as alumina, Teflon (polytetrafluoroethylene (PTFE)), Polyflon, beryllia, sapphire, aluminum nitride, lithium niobate ($LiNbO_3$), random and woven fiber reinforced glass substrates, polymers, laminates, as well as any material with excellent high-frequency performance characteristics and properties, which can be made into wafers or continuous sheets of the material and then can be subsequently used to fabricate thin-film material layers thereon and fabricate capacitive devices from these thin-film layers.

It is another object of the present invention to provide a variable capacitor device wherein the packaging of the device allows environmental protection of the component, as well as low manufacturing cost.

It is a further object of the present invention to provide a variable capacitor device that has lower fabrication, assembly, tuning and maintenance costs.

It is an object of the present invention to provide a variable capacitor with improved performance, such that the device is less prone to drift due to the effects of temperature variations or other environmental changes.

It is yet another object of the present invention to provide a variable capacitor with active tuning of the capacitance of the device using a closed-loop control feedback loop.

It is yet another object of the present invention to provide a variable capacitor with active tuning of the capacitance of the device using an open-loop control feedback loop.

It is a further object of the present invention to provide a variable capacitor in which the capacitance of the device can be tuned to the correct value and then be permanently held or locked into the desired value.

It is a further object of the present invention to provide a variable capacitor device having a lower-cost and faster means by which the desired capacitance value can be tuned.

It is yet another object of the present invention to provide a variable capacitor device having a very large tuning ratio.

It is a further object of the present invention to provide a laser micromachining means of tuning the capacitor device.

It is still a further object of the present invention to provide a variable capacitor device which has a higher operational frequency and higher quality factor (Q).

It is a further object of the present invention to provide a variable capacitor device which can be made using micromechanical fabrication techniques, thereby affording the benefits of smaller size, lower cost, and increased level of integration.

It is another object of the present invention to provide a variable capacitor that has a smaller form factor.

It is a further object of the present invention to provide a variable capacitor manufacturing process that can be used to make either discrete or integrated devices at a lower cost.

It is a further object of the present invention to provide a very low-cost means to tune capacitors with a very high degree of precision and predictability at a low cost.

These and other objectives are realized in the present invention by using a novel and very flexible fabrication and tuning methodology combined with innovative design improvements. The present invention results from the realization that micromachining technology, combined with newly available materials, as well as innovative designs, allow a variable capacitor device to be embodied wherein the device will have higher operating frequency, higher quality factor (Q), lower manufacturing cost, lower installation and maintenance cost, the ability for active tuning, the ability for precise tuning, higher tuning ratio and range, smaller size, stable and low-cost packaging, extremely stable operational performance, and provides for the making of variable capacitors in either discrete component form or integrated with highly dense, complex systems.

The present invention is a microfabricated discrete variable capacitor component device. This device has application in electronic and microwave circuits with projected commercial and industrial markets of hundreds of millions to billions of devices per year. For example, tunable capacitors are commonly used in Voltage-Controlled Oscillators (VCOs) as part of inductor-capacitor (LC) tank circuits to enable frequency tuning. With the growth of wireless communications, in particular market demand for smaller and more personal communication systems, there is tremendous interest and need for smaller, more stable, less costly, more power efficient components and subsystems. Tunable capacitors are the only currently known technology that can exploit these tremendous market opportunities. An important component of the present invention is a process to fabricate a variable capacitor device that is extremely manufacturable using novel fabrication techniques, and which can be made inexpensively while obtaining extremely high values of precision on the capacitance value.

The present invention combines innovative designs with a new technology to process new substrate materials to enable high performance and low cost variable capacitor devices and a new process to tune the capacitors using laser micromachining. New substrate materials, such as LTCC, Teflon, Polyflon, random and woven fiber reinforced glass substrates, polymers, laminates, as well as any material with excellent high-frequency performance characteristics and properties have costs of one to two orders of magnitude lower than silicon substrates, with even lower costs relative to other semiconductor materials, such as GaAs. Furthermore, these substrate material technologies are able to be batch fabricated on large dimension substrates and with comparatively low processing costs, thereby enabling extremely low costs for individual variable capacitor devices. An important part of the current invention is that the variable capacitor devices can be implemented and tuned directly on these low-cost substrates, thereby avoiding the complication of hybrid assembly approaches. The present invention also enables packaging to be performed as part of the fabrication process and without significant additional costs to the component.

The present invention addresses the major factors that are considered principal issues in the implementation of a discrete tunable variable capacitor device, namely cost and device performance. Furthermore, the device design and the method of making the device are entirely manufacturable, which allows low barrier transfer of the designs and process technologies to large-scale, high-quantity production, thereby considerably reducing time to market and the cost of transfer.

The technical specifications of a desired discrete variable capacitor device are dependent on the actual design details. An illustrative example of one embodiment of the invention is described below, but the present invention can be used for other designs/embodiments with differing technical specifications with equal ease. The package of a preferred embodiment of the device has an approximate footprint of 2 mm by 2 mm and a height of 2 mm or less (with resultant volume of 8 mm$^3$ or less), but can be made smaller or larger depending on the exact range of capacitance values desired. The capacitance range of the device can be varied from below 0.1 pF to over 10 pF, but again can be made much smaller or larger in value depending on the exact capacitance value desired. The capacitance can be continuously tuned over the entire dynamic range with a tuning ratio of at least 10, but a tuning ratio of over 1000 is possible. The device capacitance can be made to vary linearly with applied voltage over the full scale of capacitance values. The working voltage of the variable capacitor ranges from 50 to 100 Volts (DC) and the device is able to withstand 100 to 200 Volts (DC) without experiencing breakdown effects. The self-resonant frequency of the device is in excess of 3 GHz, and the device has a quality factor of 100 or higher at a frequency of 3 GHz. The device can have two, four, or six ports depending on the functionality required and the specific design, and is enclosed within a surface mountable package. The variation of the capacitance with temperature is less than 100 parts per million per degree Celsius. The manufacturing cost of the discrete variable capacitor device is very low in large production volumes. The tuning of the capacitor is accomplished by laser micromachining the device so as to adjust the area of the capacitor. This tuning can be done in either an open-loop or closed-loop manner. In an open-loop tuning operation, the amount of area removed of the capacitor device is gauged from the dimensions and previously inserted registration marks on the device or substrate. Tuning accuracies of better than 1% are possible using this open-loop tuning. Closed-loop tuning is accomplished by continuously measuring the capacitance of the device and feeding this information into a control system that controls the position of the laser beam and where the area of the capacitor is being removed. Closed-loop tuning enables high precision in the tuning operation, at least 10 times better than open-loop tuning.

The MEMS-based variable capacitor device of the present invention can be surface mounted onto a printed-circuit board or other suitable substrate during the assembly of an electrical system. The tuning of the capacitor can be performed at the capacitor factory, or it can be performed after mounting of the capacitor device, wherein a separate and external laser micromachining tuning system can be applied to the variable capacitor device or circuit containing the device and "tuned" to the desired capacitance value.

In a first embodiment of the discrete variable capacitor, the device is tunable using a laser micromachining process and after tuning the capacitor maintains the desired capacitor value permanently and without any stimulation.

In the present invention, a variable capacitor device is fabricated using MEMS or micromachining techniques, wherein thin-films of materials are deposited, patterned and etched to form movable micromechanical elements on the surface of a suitable substrate. MEMS technology has advanced so as to provide a well known and documented means by which devices can be made in large quantities and at low cost due to the advantages afforded by batch fabrication, wherein the processing of a single wafer results in thousands to millions of individual devices. Although the cost of processing a batch of substrates may be relatively high, this cost is amortized over many components, thereby resulting in a very low per-component cost.

In the present invention, variable capacitors are fabricated using micromachining on suitably formed substrates of a material having excellent material performance characteristics for high-frequency applications. In particular, materials wherein the loss tangents are extremely low, even at high operational frequencies, and the k factors can be quite high. These substrates can be fabricated into a form factor essentially equivalent to a standard wafer and then processed using conventional microfabrication processing equipment. Alternatively, large panels of the substrate material could be used similar to that used in the flat panel display industry to reduce production costs even further. The material wafers or substrates may be composed of a multiplicity of layers, wherein each layer has the means by which electrical connections and interconnections, through wafer vias, discrete components, sealable cavities, and bonded integrated circuits can be incorporated with relative ease. The individual layers can be aligned and stacked together, and then heat treated or "fired" to sinter the ceramic material. This results in a substrate that is strong, robust, and stable and able to be handled with ease for further processing or assembly, depending on the application. Beyond the excellent high-frequency performance characteristics of these substrates is the relative ease by which complex three-dimensional circuits can be formed in the layers.

The present invention allows the tuning ratio of the variable capacitor of the present invention to be increased to very large values. The tuning ratio for a variable capacitor is the ratio of the maximum capacitance to the minimum capacitance of the device. The ability for a wider dynamic range of capacitance values in a variable capacitor device is a very desirable attribute that is not possible with prior technology implementations. The present invention includes a novel method whereby the tuning ratio can be made to extremely high values.

Finally, the present invention also provides a means by which the desired capacitance value of the variable capacitor device can be "locked" or "held" to a desired value. This is useful so as to ensure that the capacitance value is stable over time and over changing environmental conditions.

DETAILED DESCRIPTION OF THE INVENTION

Figure 1:
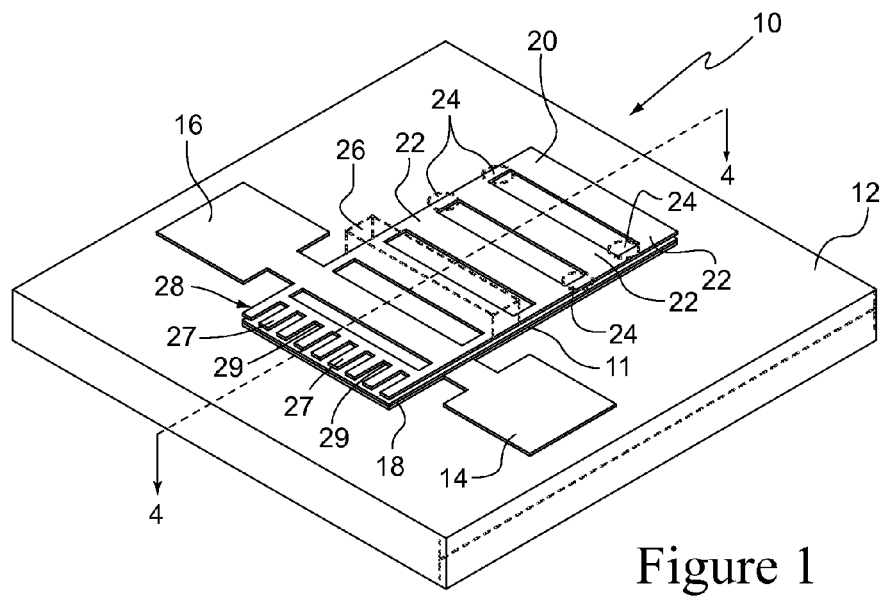
FIG. 1 is top perspective view of one embodiment of the variable capacitor of the present invention.

The present invention is directed to a variable capacitor, either in discrete or integrated form, which is used in electronic circuits. A top perspective view of one embodiment of a discrete variable capacitor 10 of the present invention is shown in FIG. 1. This device is essentially a microfabricated capacitor made using thin film deposition and photolithographic processes that has a shape to facilitate a laser micromachining tool to subsequently trim the device to the desired capacitance value.

Figure 3:
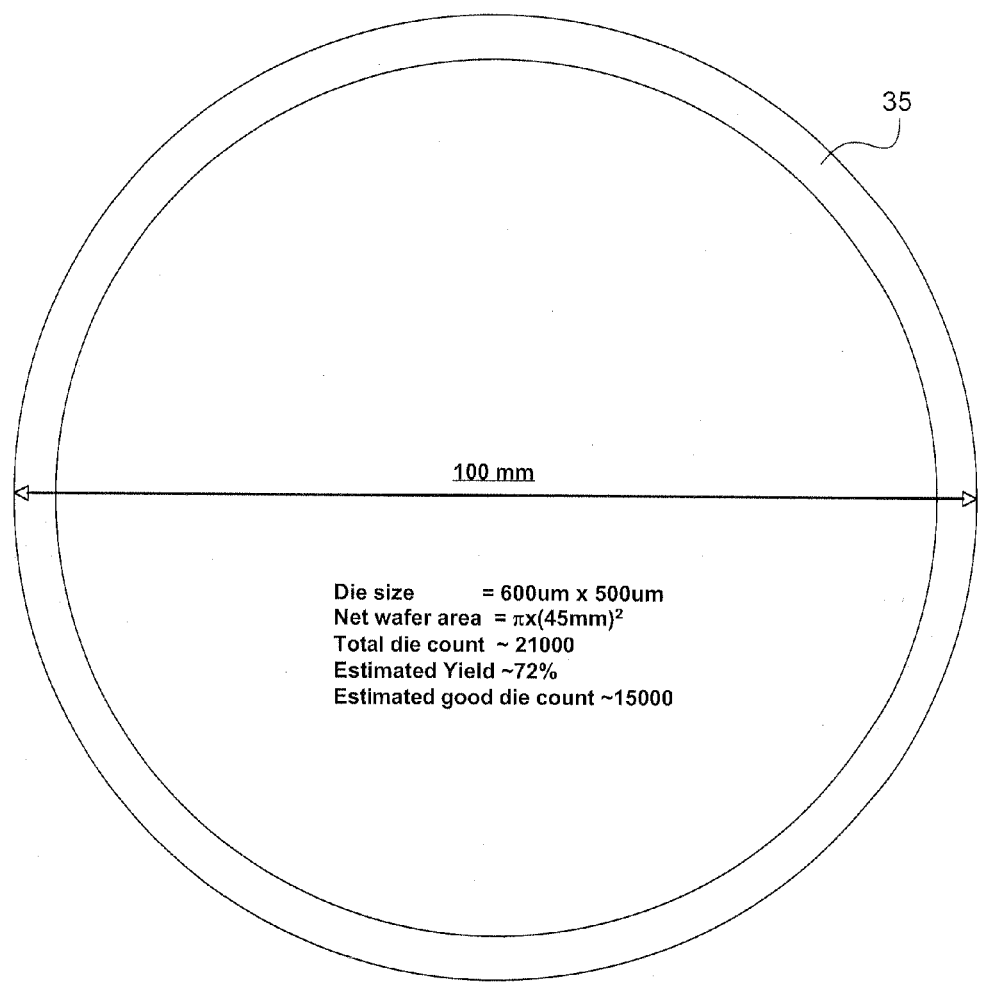
FIG. 3 is a plan view of a wafer on the surface of which individual discrete capacitor dies can be micromachined.
Figure 4A:
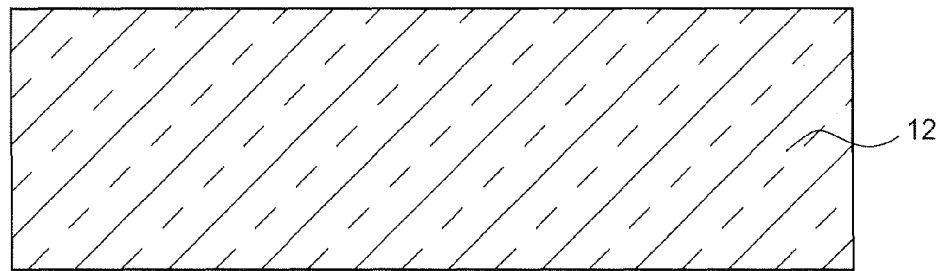
FIGS. 4(a)-(e) are a series of cross sectional views showing processes for fabricating alternative embodiments of the variable capacitor of the present invention.

The process sequence for making the capacitor shown in FIGS. 4(a) to (e) is inherently simple, low cost, extremely accurate, and can be done in batch fabrication (i.e., many devices made on each substrate wafer, such as the wafer shown in FIG. 3) similar to integrated circuits. As shown in FIG. 1, capacitor 10 is fabricated on a substrate 12, which is cut from a larger substrate wafer, like wafer 35 shown in FIG. 3. It should be noted that wafer 35 is one example of a wafer that can be used for the fabrication of multiple capacitors 10, and that other kinds of wafers could be used, depending on the type of capacitor to be fabricated. Thus, as shown in FIG. 4(a), the fabrication of capacitor 10 begins with the selection of a suitable substrate 12, which can be made from any suitable material having excellent RF or microwave performance characteristics, as well as low cost. Preferably, substrate 12 is made from glass, sapphire, LTCC, alumina, Teflon, or any semi-insulating or insulating materials.

As shown in FIG. 1, capacitor 10 includes two electrodes 14 and 16, also fabricated on substrate 12. Preferably, electrodes 14 and 16 are deposited onto substrate 12 by sputtering or evaporation, and are made from a high quality and highly conductive metal, such as gold, copper, silver or similarly highly electrically-conductive materials.

Figure 4B:
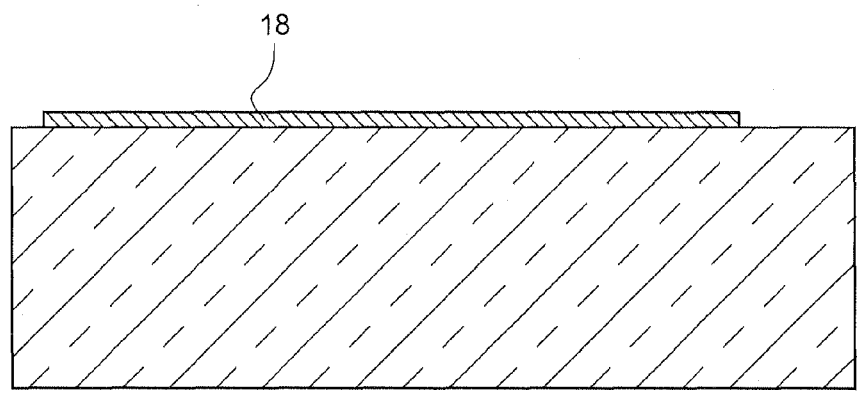
Figure 4C:
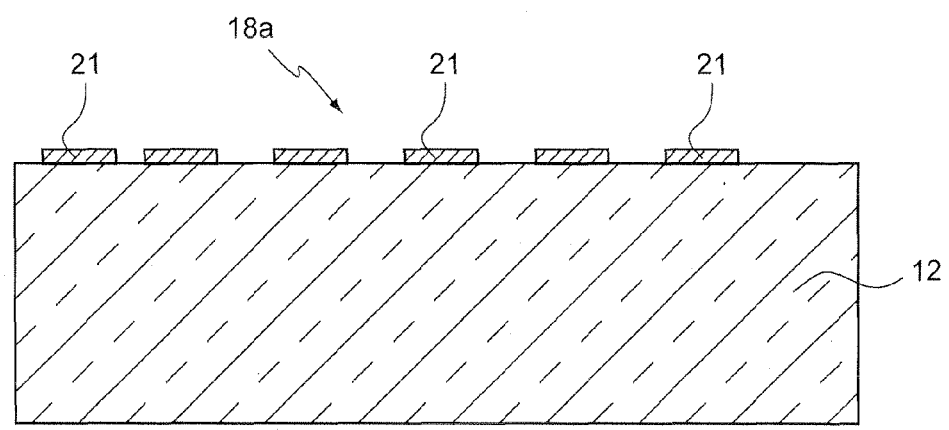
Figure 4D:
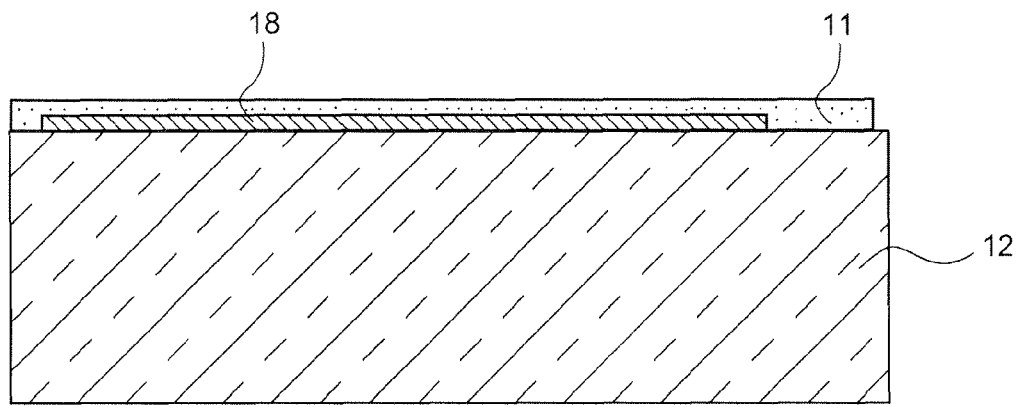
Figure 4E:
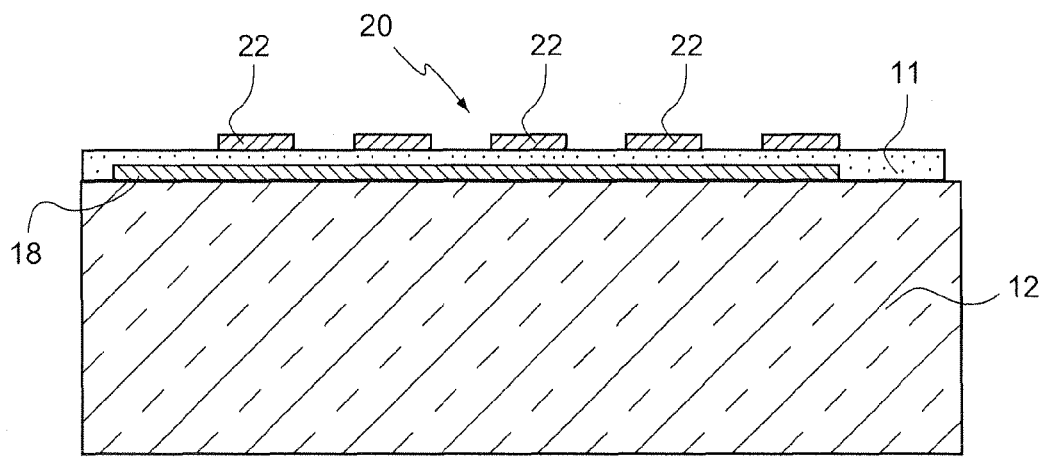

As is further shown in FIG. 1, capacitor 10 also includes two plates, 18 and 20, and a dielectric 11 positioned between them. As shown in FIG. 4(b), first plate 18 is fabricated directly on substrate 12 as a single, continuous thin film of a suitable conductive material deposited on substrate 12. Plate 18 is also connected to electrode 14. As shown in FIG. 4(c), an alternative first plate 18A is fabricated on substrate 12 as a plurality of discrete dis-continuous thin film subparts 21 deposited on substrate 12 and connected by a plurality of trimmable connections (not shown in FIG. 4(c)). As shown in FIG. 4(d), dielectric 11 is then fabricated by the deposition of a suitable insulation material over first plate 18 (or over the subparts 21 of alternative first plate 18A). Finally, as shown in FIG. 4(e), a second plate 20 is fabricated by the deposition of a suitable conductive material over dielectric 11 so that dielectric 11 is positioned between first and second plates 18 and 20. Like the alternative embodiment of plate 18A shown in FIG. 4(c), second plate 20 is fabricated over first plate 18 as a plurality of discrete dis-continuous thin film subparts 22 initially connected by a plurality of trimmable connections 24 (not shown in FIG. 4(e), but shown in FIG. 1).

Plates 18 and 20 can be made from a high quality and highly conductive metal, such as gold, copper, silver or similarly highly electrically-conductive materials. Dielectric 11 can be made from any high-quality insulator material, such as silicon dioxide, silicon nitride, hafnium oxide, alumina and zirconium oxide, strontium oxide, titanium oxide, barium titanate, barium strontium titanium oxide (BSTO), PZT lead zirconate titanate piezoelectric ceramic material ("PZT"), and dielectric forms of carbon nanotubes, deposited using Chemical Vapor Deposition (CVD) or Atomic Layer Deposition (ALD) or a similar technique.

As discussed above, plate 20 is formed from a plurality of subparts 22 that can be trimmed to change the capacitance value of capacitor 10. The plurality of subparts 22 are connected together by a plurality of trimmable connections 24, with each of the plurality of subparts 22 being connected to each subpart 22 adjacent to the subpart by a plurality of trimmable connections 24. As shown in the embodiment of FIG. 1 the plurality of trimmable, connections 24 are two connections 24 located at the ends of adjacent subparts 22. As also shown in FIG. 1, one of the subparts designated with the reference numeral 28 in FIG. 1 is comprised of a plurality of further subparts 27 that are smaller in dimensions than the one subpart 28. These further subparts 27 are connected together by a plurality of further connections 29, which also comprise part of the one subpart 28. Each of the further arts 27 can be trimmed from the one subparts 28 to change the capacitance value of capacitor 10. As discussed above, alternatively, both of plates 18 and 20 could include a plurality of subparts, like subparts 22, that are connected together by a plurality of trimmable connections, like connections 24, and that could be trimmed to change the capacitance value of capacitor 10.

Having both of plates 18 and 20 made from a plurality of subparts that are trimmed to change the capacitance value of capacitor 10 minimizes the effect of fringe capacitance that can occur where only subparts of one of the two plates 18 and 20 are trimmed. Also, having both of plates 18 and 20 made from a plurality of subparts that are trimmed results in a greater ability to accurately predict the capacitive value that will result from the trimming of the capacitive plates.

The dimensions 26 shown in phantom in FIG. 1 for each of subparts 22 and/or 21 are defined so as to provide a tuning range for capacitor 10. Preferably, each of subparts 22 and/or 21 have predefined dimensions that are comparable so that the capacitive value of capacitor 10 can be varied by the same discrete amount for each subsection 22 that is trimmed from capacitor 10. Thus, for example, each subpart 22 (and or 21) can be dimensioned to vary the capacitance of capacitor 10 by 0.2 pF. Thus, capacitor 10 could have a sufficient number of subparts 22 (and/or 21) so as to provide a range of capacitive values from 0.2 pF to 2 pF or higher, depending on the number of subparts 22 (and/or 21) trimmed from capacitor 10. Because the further subparts 27 comprising the one subpart 28 are smaller in dimensions than each of the subparts 22, as can be seen in FIG. 1, the capacitive value of capacitor 10 will be varied by a discrete amount for each further subpart 27 that is trimmed from capacitor 10 that is less than the amount capacitive value of capacitor 10 will be varied for each subpart 22 that is trimmed from capacitor 10.

It should be noted that this range is merely illustrative and that a large range of other dimensions could be used to vary the capacitance of capacitor 10 by a value different from 0.2 pF. It should also be noted that each of subparts 22 (and/or 21) could have varying predefined dimensions so that the capacitive value of capacitor 10 can be varied by different values, depending on the subparts selected to be trimmed from capacitor 10 and the number of subparts trimmed. Thus, capacitor 10 could have a first number of subparts 22A that will vary the capacitive value of capacitor 10 by 0.2 pF for each subpart 22A trimmed and a second number of subparts 22B that will vary the capacitive value of capacitor 10 by 0.5 pF for each subpart 22B trimmed. Depending on the number of subparts 22A and/or 22B trimmed from capacitor 10, a range of capacitive values could be obtainable. Indeed, whether comparably dimensioned or variably dimensioned subparts are used, the embodiment of the invention shown in FIG. 1 allows a capacitor structure to be achieved having a different absolute tuning range or a larger tuning range, as desired. The same variation in values could be used with subparts 21.

Each of the subparts 22 and/or 21 can change the capacitive value of the capacitor device 10 by a predetermined amount, depending on whether the subpart 22 and/or 21 is trimmed or not trimmed from the second plate 20 and/or first plate 18 of capacitor 10, and on the number of subparts 22 and/or 21 included in capacitor 10. This allows capacitor device 10 to be tunable over a range of capacitive values with a tuning ratio of at least 10, but a tuning ratio of over 1000 is possible.

An important element in the present invention is the method used to tune individual capacitors. This tuning is done using a high-power pulsed-laser diode, like the laser cutter/trimmer 32 shown in FIG. 2, and a precise scanning stage (not shown) for moving the wafer 35 relative to the laser 32. The high-powered laser 32 easily, accurately, and quickly cuts through the layers on the surface of the substrate 12 at predefined locations on the capacitor 10, like the trimmable connections 24 shown in FIG. 1, so as to allow the capacitor 10 to be precisely tuned to a desired value. The laser cutter/trimmer 32 has a scanning speed of 0.5 inch$^2$/min. or higher, thereby enabling each capacitor 10 to be quickly tuned to a desired value at a high throughput.

Figure 2:
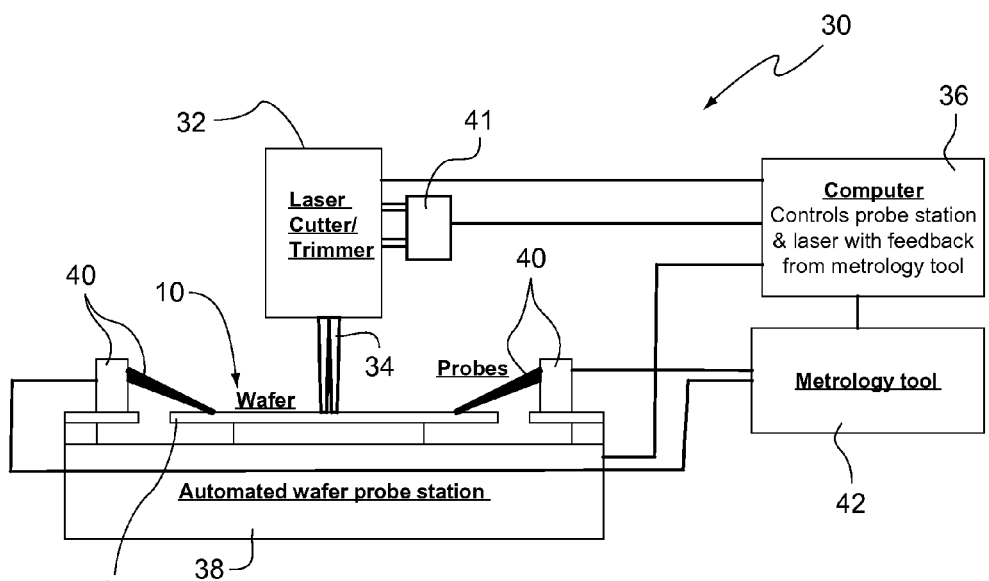
FIG. 2 is a side-sectional view of a closed-loop controlled embodiment of a tuning process used for making the variable capacitor of the present invention.

There are two main techniques that can be used with the laser cutter/trimmer 32 to tune capacitors to a desired value. The first method is to perform a registration on where the laser beam 34 is precisely registered to the capacitor devices 10 on a wafer substrate 35 to be micromachined. This registration can be done to an accuracy of 2 um or better. Then, the laser micromachining system is run open-loop and the individual capacitors are tuned by cutting trimming connections, like connections 24, as shown in FIGS. 1 and 2. Given that the width of the laser micromachining cut is 25 um or less, the capacitor can be easily tuned to less than 1% of its value.

The second method provides a higher degree of precision in the tuning process and involves configuring a closed-loop control of the laser micromachining system 32 and obtaining an electrical measurement of the capacitance value of each capacitor 10 on a substrate 35 using a Capacitance-Voltage (C-V) or similar measurement system 30. One embodiment of such a closed-loop control C-V measurement system 30 for capacitor trimming is shown in FIG. 2. System 30 includes a computer 36, which controls the operation of laser cutter/trimmer 32 and an automated wafer probe station 38, preferably with a plurality of probes 40 to provide a real-time capacitance measurement of each capacitor device 10 on substrate, while the laser cutter/trimmer 32 is micromachining capacitor devices 10 to achieve desired capacitance values in such devices. A metrology tool 42 connected to probes 40 provides feedback to computer 36 to control the movement of laser cutter/trimmer 32 over wafer. A suitable software program resident in computer 36 interprets the feedback received from probes 40 through metrology tool 42, and then uses the information received from such probes to control the position of the laser cutter/trimmer 32, and thus the laser beam 34 emanating from laser 32, on the capacitor devices 10, to thereby trim the capacitors to desired values of capacitance. The second tuning system shown in FIG. 2 is more complicated, since electrical probing of each capacitor 10 is needed, but it increases the tuning accuracy by at least a factor of 10 over the open-loop method discussed above.

Alternatively, instead of an electrically-based measurement in order to implement a closed-loop feedback control of the laser cutting of the individual capacitors to the desired values, a dimensional-based measurement could be implemented as well in a closed-loop control manner, as shown in FIG. 2. This dimensional-based measurement system could include an optical system 41 that would image a capacitor being trimmed to provide information to computer 36 for the calculation of the dimensions of capacitor 10, and, thus, its capacitance value.

There are several key elements of the design and processing approaches illustrated in FIGS. 1 and 2. First, the substrate materials used can have extremely low resistive losses even at frequencies well above 10 GHz. Second, there are no moving parts in the capacitor structure, and therefore these designs are far simpler and inherently more reliable. Laser micromachining to make MEMS devices has been performed for some time and the technology is reliable, repeatable, fast, provides a high degree of precision, and is production worthy.

Third, the substrate material technology combined with microfabrication techniques easily allows enormous design flexibility. This approach enables passive devices, such as resistors and continuous electrical connections across and/or through the different layers, flip-chip bonding of ICs onto electrical bonding pads fabricated onto the surface of the substrate, high quality bonding of multiple layers of substrates, and the potential for needing no additional packaging.

Fourth, both approaches are low cost, and, combined with the capability of batch fabrication of micron-scaled components, allows the cost of individual components or systems to be dramatically reduced over competing technologies.

The laser-micromachined tuned variable capacitor device only needs to be tuned to the desired value once and thereafter the capacitor will remain permanently held at that value. The tuning process can be accomplished either open-loop or closed-loop, but in either case, provides a very high degree of precision on the tuned capacitance value. The tuning of this design could be performed at the factory and then the capacitors would be shipped to customers at their desired values.

Alternatively, the capacitor substrates 12 could be mounted in the un-trimmed state onto Printed Circuit Boards (PCBs) or similar electronic substrates, connected to the rest of the circuitry on the PCB or similar and then trimmed to the desired value using the trimming methods described above.

The choices for the substrate material technology that can be used for the present invention is far larger than that available for previous approaches. Virtually any substrate material can be used for the approach of the present invention, and therefore, affords the opportunity to optimize the device performance or cost, or both, depending on the application and customer requirements.

The substrate material can be either a solid bulk substrate material (i.e., alumina wafer) or composed of a stack of layers, wherein each layer can be uniquely patterned with openings that can be filled with low shrinkage highly conductive inks to provide electrical connections through the layers (i.e., LTCC), depending on the device performance requirements. The metal electrodes for the capacitor and metal lines for the electrical connections can be patterned using photolithography on the surfaces of the substrate with a minimum resolution of less than one micron. Available material choices for the metal electrodes and connections include excellent conductors, such as gold, silver, copper or similar metals. These are the preferred materials to use for high frequency microwave applications. Passive components, such as resistors and ground planes, can also be realized on the substrate surfaces. The process will be immediately transferable to larger-scale production without necessarily incurring huge capital equipment costs or other costs associated with the transfer of the process technology from prototyping to production.

A functional requirement of the MEMS variable capacitor device is the capability of "holding" or "locking in" a desired tuned capacitance value. This approach is far simpler than the previous approach, in that the capacitor is tuned once and stays at the value permanently.

A tuned variable capacitor having the following characteristics is reasonable:

Tuning Range: 100 to 1 or higher.
Capacitance Range: 0.1 pF to 100 pF or larger
Quality Factor: 100 or higher at 2.5 GHz
Withstanding Voltage: 100 to 200 Volts
Temperature Coefficient: <100 parts per million per degree Celsius Even more than the electrostatically-tunable variable capacitor approach, the laser micromachined tuned variable capacitor device has a very low production cost. Conservative production cost estimates vary according to wafer substrate sizes and other statistics relating to yield and good die count, such as those and the wafer shown in FIG. 3, on the surface of which individual discrete capacitor dies can be micromachined. Importantly, conservative production cost estimates for a 100 mm diameter would drop to less than half if produced on a 150 mm diameter wafer, and be less than half again if produced on a 200 mm diameter wafer. Even lower costs could be realized with capacitors fabricated on larger substrates.

The cost of transitioning the laser micromachined tuned variable capacitor device from a prototyping environment to production can be dependent upon how much of the fabrication and tuning is out-sourced to a foundry. The fabrication of the capacitors on the substrates can be easily out-sourced to a foundry and then laser micromachining can be either out-sourced of performed in-house. Typically, where the laser micromachining is performed in-house, the transition cost of setting up a production system is often higher.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of tuning capacitor devices fabricated on a wafer substrate, each capacitor device comprising:
a first plate fabricated on the substrate,
a dielectric fabricated on the first plate,
a second plate fabricated on the dielectric so that the dielectric is located between the first and second plates,
the second plate including a plurality of subparts, each of the plurality of subparts including a first end and a second end and being connected to each subpart adjacent to the subpart at the first and second ends by a corresponding pair of first and second trimming connections located, respectively, at the first and second ends of the subpart, such that the plurality of subparts are connected together by a plurality of corresponding pairs of first and second trimming connections, each of the subparts having predefined dimensions so as to provide a tuning range for the capacitor's capacitance value,
the method comprising the steps of:
providing a laser device that emits a laser beam for cutting and thereby trimming subparts of the second plate,
registering the laser beam to the capacitor device on the wafer substrate to be tuned,
moving the laser beam along the capacitor device on an open-loop basis according to registration marks inserted on the wafer substrate and thereby cutting at least one corresponding pair of first and second trimming connections,
whereby the capacitor's capacitance value is tuned to a predetermined value by the at least one of the corresponding pairs of first and second trimming connections being cut by the laser beam.

2. A method of tuning capacitor devices fabricated on a wafer substrate, each capacitor device comprising:
a first plate fabricated on the substrate,
a dielectric fabricated on the first plate,
a second plate fabricated on the dielectric so that the dielectric is located between the first and second plates,
the second plate including a plurality of subparts, each of the plurality of subparts including a first end and a second end and being connected to each subpart adjacent to the subpart at the first and second ends by a corresponding pair of first and second trimming connections located, respectively, at the first and second ends of the subpart, such that the plurality of subparts are connected together by a plurality of corresponding pairs of first and second trimming connections, each of the subparts having predefined dimensions so as to provide a tuning range for the capacitor's capacitance value, the method comprising the steps of:

providing a laser device that emits a laser beam for cutting and thereby trimming subparts of the second plate, registering the laser beam to the capacitor device on the wafer substrate to be tuned, moving the laser beam along the capacitor device and thereby cutting at least one corresponding pair of first and second trimming connections, obtaining a measurement of the capacitance value of the capacitor, determining, on the basis of the measurement of the capacitance value of the capacitor to either continue moving the laser beam along the capacitor device and thereby cutting at least one additional corresponding pair of first and second trimming connections, or stop moving the laser beam along the capacitor device, whereby the capacitor's capacitance value is tuned to a predetermined value by the at least one of the corresponding pairs of first and second trimming connections being cut by the laser beam.

3. The method of claim 2 further comprising the steps of:

providing a computer for controlling the operation of the laser device, providing an automated wafer probe station with at least one probe for providing a real-time capacitance measurement of the capacitor device while the laser is cutting and thereby trimming the capacitor device, and providing a metrology tool connected to the at least one probe to provide feedback to the computer to control the movement of the laser over the capacitor device on the wafer.

4. The method of claim 3, wherein the computer includes a software program that interprets the feedback received from the at least one probe through metrology tool, and then uses the feedback to control the position of the laser, and thus the laser beam on the capacitor device to thereby trim the capacitor to the predetermined value of capacitance.

5. The method of claim 2, wherein each of subparts has predefined dimensions that are comparable each of the other subparts' dimensions so that the capacitive value of the capacitor will be changed by a single predefined amount for each subsection that is trimmed from the capacitor.

6. The method of claim 2, wherein each of subparts has predefined dimensions that are comparable to at least some of the other subparts' dimensions and that varying from at least others of the other subparts' dimensions so that the capacitive value of the capacitor will be changed by a variable amount, depending on the particular subsections trimmed and the number of subsections trimmed from the capacitor.

7. The method of claim 2, wherein the first and second plates and the dielectric are made from thin film depositions using photolithographic processes.

8. The method of claim 2, wherein the dielectric is made from an insulator material deposited on the substrate using a deposition process selected from the group consisting of chemical vapor deposition and atomic layer deposition.

9. The method of claim 2, wherein one of the plurality of subparts is comprised of a plurality of further subparts that are smaller in dimensions than each of the plurality of subparts, each of the plurality of further subparts being connected to each further subpart adjacent to the further subpart by a further trimming connection that is different from the corresponding pairs of first and second trimming connections and that is also part of the one subpart comprised of the plurality of further subparts.

10. A method of tuning capacitor devices fabricated on a wafer substrate, each capacitor device comprising:

a first plate fabricated on the substrate, a dielectric fabricated on the first plate, a second plate fabricated on the dielectric so that the dielectric is located between the first and second plates, the second plate including a plurality of subparts, each of the plurality of subparts including a first end and a second end and being connected to each subpart adjacent to the subpart at the first and second ends by a corresponding pair of first and second trimming connections located, respectively, at the first and second ends of the subpart, such that the plurality of subparts are connected together by a plurality of corresponding pairs of first and second trimming connections, each of the subparts having predefined dimensions so as to provide a tuning range for the capacitor's capacitance value, the method comprising the steps of:

providing a laser device that emits a laser beam for cutting and thereby trimming subparts of the second plate, registering the laser beam to the capacitor device on the wafer substrate to be tuned, moving the laser beam along the capacitor device and thereby cutting at least one corresponding pair of first and second trimming connections, obtaining a measurement of the dimensions of the capacitor and thereby estimating the capacitance value, determining, on the basis of the measurement of the capacitance value of the capacitor to either continue moving the laser beam along the capacitor device and thereby cutting at least one additional corresponding pair of first and second trimming connections, or stop moving the laser beam along the capacitor device, whereby the capacitor's dimensions and resultant capacitance value is tuned to a predetermined value by the at least one of the trimming connections being cut by the laser beam.

11. The method of claim 10 further comprising the steps of:

providing a computer for controlling the operation of the laser device, providing an automated wafer probe station and optical system for providing a real-time dimensional measurement of the capacitor device dimensions while the laser is cutting and thereby trimming the capacitor device, and providing a metrology tool connected to the at least one probe to provide feedback to the computer to control the movement of the laser over the capacitor device on the wafer.

12. The method of claim 11, wherein the computer includes a software program that interprets the feedback received from the at least one probe through metrology tool, and then uses the feedback to control the position of the laser, and thus the laser beam on the capacitor device to thereby trim the capacitor to the predetermined value of capacitance.

13. The method of claim 10, wherein each of subparts has predefined dimensions that are comparable each of the other subparts' dimensions so that the capacitive value of the capacitor will be changed by a single predefined amount for each subsection that is trimmed from the capacitor.

14. The method of claim 10, wherein each of subparts has predefined dimensions that are comparable to at least some of the other subparts' dimensions and that varying from at least others of the other subparts' dimensions so that the capacitive value of the capacitor will be changed by a variable amount, depending on the particular subsections trimmed and the number of subsections trimmed from the capacitor.

15. The method of claim 10, wherein the first and second plates and the dielectric are made from thin film depositions using photolithographic processes.

16. The method of claim 10, wherein the dielectric is made from an insulator material deposited on the substrate using a deposition process selected from the group consisting of chemical vapor and atomic layer deposition.

17. The method of claim 10, wherein one of the plurality of subparts is comprised of a plurality of further subparts that are smaller in dimensions than each of the plurality of subparts, each of the plurality of further subparts being connected to each further subpart adjacent to the further subpart by a further trimming connection that is different from the corresponding pairs of first and second trimming connections and that is also part of the one subpart comprised of the plurality of further subparts.

18. A method of tuning variable capacitor devices fabricated on a wafer substrate, each capacitor device comprising:
a first plate fabricated on the substrate,
a dielectric fabricated on the first plate,
a second plate fabricated on the dielectric so that the dielectric is located between the first and second plates,
the second plate including a plurality of subparts, each of the plurality of subparts including a first end and a second end and being connected to each subpart adjacent to the subpart at the first and second ends by a corresponding pair of first and second trimming connections located, respectively, at the first and second ends of the subpart, such that the plurality of subparts are connected together by a plurality of corresponding pairs of first and second trimming connections, each of the subparts having predefined dimensions so as to provide a tuning range for the capacitor's capacitance value,
wherein the capacitor device has been mounted in an untrimmed state onto a Printed Circuit Board or ceramic substrate and then trimmed using the method comprising the steps of:
providing a laser device that emits a laser beam for cutting and thereby trimming subparts of the second plate,
registering the laser beam to the capacitor device on the wafer substrate to be tuned,
moving the laser beam along the capacitor device and thereby cutting at least one corresponding pair of first and second trimming connections,
obtaining a measurement of the capacitance value of the capacitor,
determining, on the basis of the measurement of the capacitance value of the capacitor to either continue moving the laser beam along the capacitor device and thereby cutting at least one additional corresponding pair of first and second trimming connections, or stop moving the laser beam along the capacitor device, whereby the capacitor's capacitance value is tuned to a predetermined value by the at least one of the trimming connections being cut by the laser beam.

19. The method of claim 18 further comprising the steps of:
providing a computer for controlling the operation of the laser device,
providing an automated wafer probe station with at least one probe for providing a real-time capacitance measurement of the capacitor device dimensions while the laser is cutting and thereby trimming the capacitor device, and
providing a metrology tool connected to the at least one probe to provide feedback to the computer to control the movement of the laser over the capacitor device on the wafer.

20. The method of claim 19, wherein the computer includes a software program that interprets the feedback received from the at least one probe through metrology tool, and then uses the feedback to control the position of the laser, and thus the laser beam on the capacitor device to thereby trim the capacitor to the predetermined value of capacitance.

21. The method of claim 19, wherein each of subparts has predefined dimensions that are comparable each of the other subparts' dimensions so that the capacitive value of the capacitor will be changed by a single predefined amount for each subsection that is trimmed from the capacitor.

22. The method of claim 19, wherein each of subparts has predefined dimensions that are comparable to at least some of the other subparts' dimensions and that varying from at least others of the other subparts' dimensions so that the capacitive value of the capacitor will be changed by a variable amount, depending on the particular subsections trimmed and the number of subsections trimmed from the capacitor.

23. The method of claim 19, wherein the first and second plates and the dielectric are made from thin film depositions using photolithographic processes.

24. The method of claim 19, wherein the dielectric is made from an insulator material deposited on the substrate using a deposition process selected from the group consisting of chemical vapor and atomic layer deposition.

25. The method of claim 18, wherein one of the plurality of subparts is comprised of a plurality of further subparts that are smaller in dimensions than each of the plurality of subparts, each of the plurality of further subparts being connected to each further subpart adjacent to the further subpart by a further trimming connection that is different from the corresponding pairs of first and second trimming connections and that is also part of the one subpart comprised of the plurality of further subparts.

* * * * *